(12) United States Patent
Butler et al.

(10) Patent No.: US 7,420,299 B2
(45) Date of Patent: Sep. 2, 2008

(54) LITHOGRAPHIC APPARATUS AND DEVICE MANUFACTURING METHOD

(75) Inventors: Hans Butler, Best (NL); Franciscus Adrianus Gerardus Klaassen, Best (NL)

(73) Assignee: ASML Netherlands B.V., Veldhoven (NL)

( * ) Notice: Subject to any disclaimer, the term of this patent is extended or adjusted under 35 U.S.C. 154(b) by 203 days.

(21) Appl. No.: 11/509,807

(22) Filed: Aug. 25, 2006

(65) Prior Publication Data

US 2008/0073561 A1    Mar. 27, 2008

(51) Int. Cl.
*H02K 9/19* (2006.01)
(52) U.S. Cl. .......................................................... 310/12
(58) Field of Classification Search ................... 310/12, 310/16; 355/53, 72; 250/442.11
See application file for complete search history.

(56) References Cited

U.S. PATENT DOCUMENTS 6,184,596 B1 * 2/2001 Ohzeki ......................... 310/12
6,720,680 B1 * 4/2004 Tanaka ......................... 310/12
7,282,821 B2 * 10/2007 Kubo et al. .................... 310/12
2005/0255624 A1   11/2005 Miyajima

* cited by examiner

*Primary Examiner*—Kiet T Nguyen
(74) *Attorney, Agent, or Firm*—Pillsbury Winthrop Shaw Pittman LLP

(57) ABSTRACT

A stage system for a lithographic apparatus is presented and includes a movable stage, and a stationary motor coil assembly including coils to interact with a magnet of the movable stage to thereby form a moving magnet motor to drive the stage. The stage system also includes a position measurement system to measure a position of the stage in a working area, the position measurement system to transfer a measurement beam along a measurement beam path which extends over a part of the motor coil assembly towards the stage. The coil assembly includes a coil assembly path between the motor coils to drive the motor, the coil assembly path extending below the measurement beam path. The stage may include a substrate stage or a reticle stage.

19 Claims, 3 Drawing Sheets

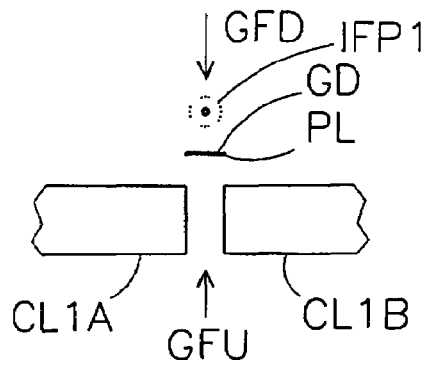
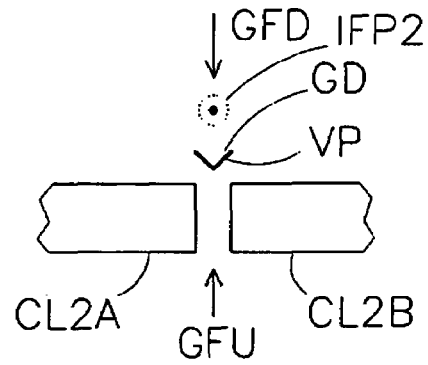
Fig 4a    Fig 4b
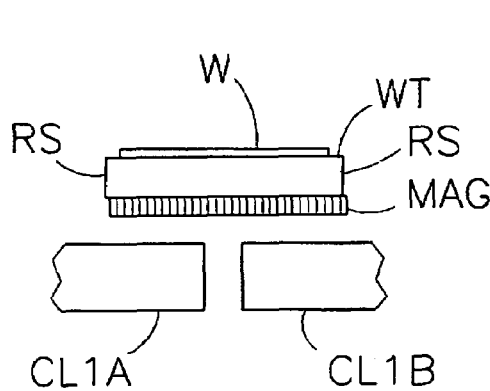
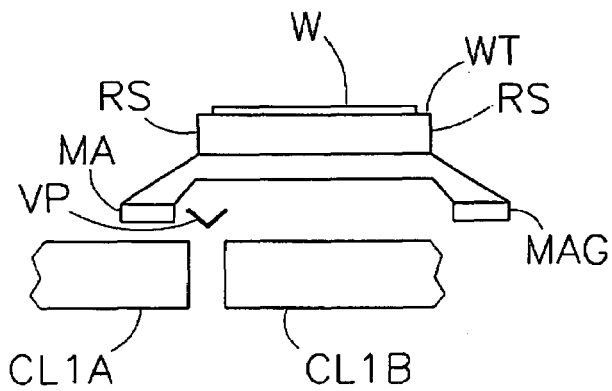
Fig 5a    Fig 5b
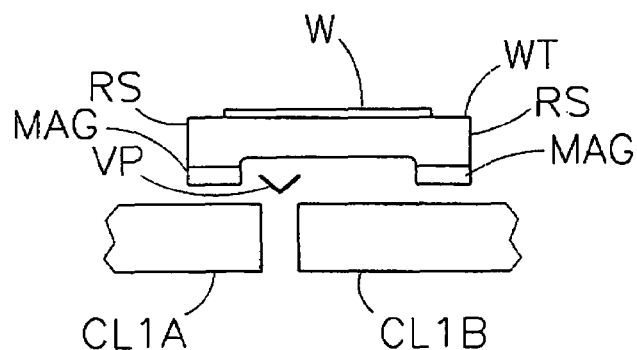
Fig 5c

LITHOGRAPHIC APPARATUS AND DEVICE MANUFACTURING METHOD

BACKGROUND

1. Field of the Invention

The present invention relates to a stage system for a lithographic apparatus, a lithographic apparatus including such stage system and to a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

US patent application 2005/0255624 describes a substrate stage of a lithographic apparatus. The substrate stage is driven by a motor to be movable in a plane. The motor includes a stationary coil which, when operated, creates a field to interact with magnets included in the substrate table to thereby generate a force acting on the substrate table. The stationary coil includes a plurality of stationary coil sections, to enable simultaneous independent driving of two stages. The coil sections are overlapping to enable the stages to be swapped. A position of each of the stages is measured by a plurality of interferometers.

Accuracy of the interferometer measurements are affected by thermal effects due to a heat generated by the coils. A measurement by an interferometer is based on a wavelength of an interferometer beam. The wavelength of the interferometer beam is dependent on a temperature of a medium through which the interferometer beam travels. The interferometer beams at least partly travel along a path over the stationary coil. Dissipation in the coil (or in sections thereof) by a powering of the motor to drive the stage, may therefore have an effect on a temperature along the path of the interferometer beam, thereby affecting a wavelength of the beam, and consequently an outcome of a determination of a position of the stage from an interferometer readout.

SUMMARY

It is desirable to improve an accuracy of a position measurement of the stage of the lithographic apparatus.

According to an embodiment of the invention, there is provided a stage system for a lithographic apparatus, the stage system including a movable stage, a stationary motor coil assembly including a plurality coils to interact with a magnet assembly of the movable stage to thereby form a moving magnet motor to drive the stage, a position measurement system to measure a position of the stage in a working area, the position measurement system to transfer a measurement beam along a measurement beam path which extends over a part of the motor coil assembly towards the stage, the motor coil assembly including a coil assembly path between the motor coils to drive the motor, the coil assembly path extending below the measurement beam path.

In an embodiment, the magnet assembly includes a plurality of magnets. In another embodiment, the magnet assembly includes one magnet.

In another embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the lithographic apparatus includes a stage system according to an embodiment of the invention, the stage of the stage system including at least one of the substrate table and the support.

According to a further embodiment of the invention, there is provided a method of manufacturing a device, including irradiating a pattern onto a substrate by a lithographic apparatus according to an embodiment of the invention; developing the irradiated substrate; and manufacturing a device from the developed substrate.

In an embodiment, there is provided a stage system for a lithographic apparatus, the stage system including a movable stage, a positioning device configured to position the movable stage, the positioning device including a coil assembly and a magnet assembly, the coil assembly configured to interact with the magnet assembly to position the movable stage, the coil assembly including at least a pair of coils that are spaced apart so as to define a path therebetween; and a position measurement system configured to measure a position of the movable stage, the position measurement system configured to output a measurement radiation beam along a measurement beam path that extends over a part of the coil assembly towards the movable stage, the measurement beam path being substantially parallel to and positioned above the path between the pair of coils.

In an embodiment, the coil assembly includes more than one pair of coils.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 4A and 4B depict cross sectional side views of stage systems according to further embodiments of the invention; and FIGS. 5A, 5B and 5C depict cross sectional side views of stage systems according to further embodiments of the invention.

DETAILED DESCRIPTION

Figure 1:
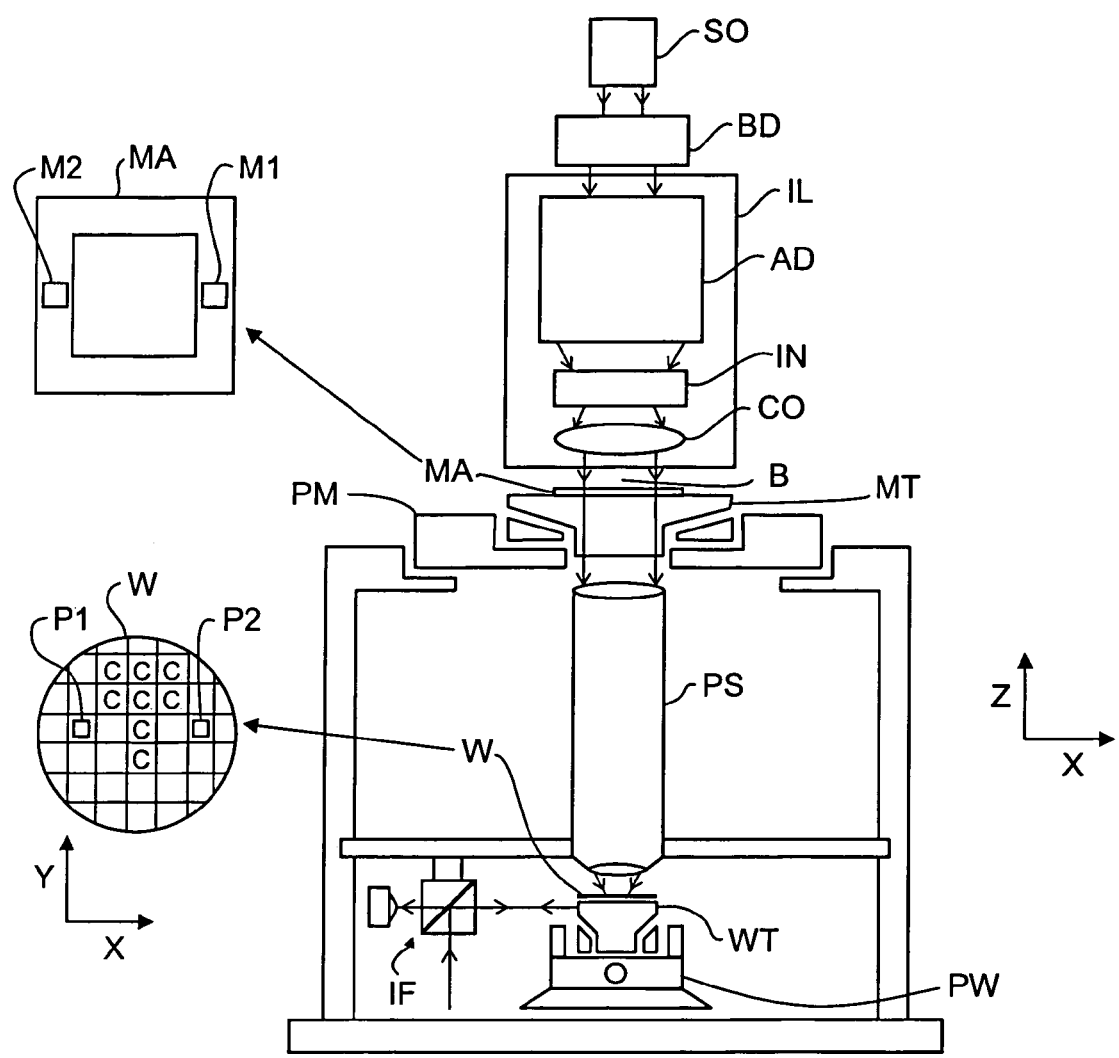
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
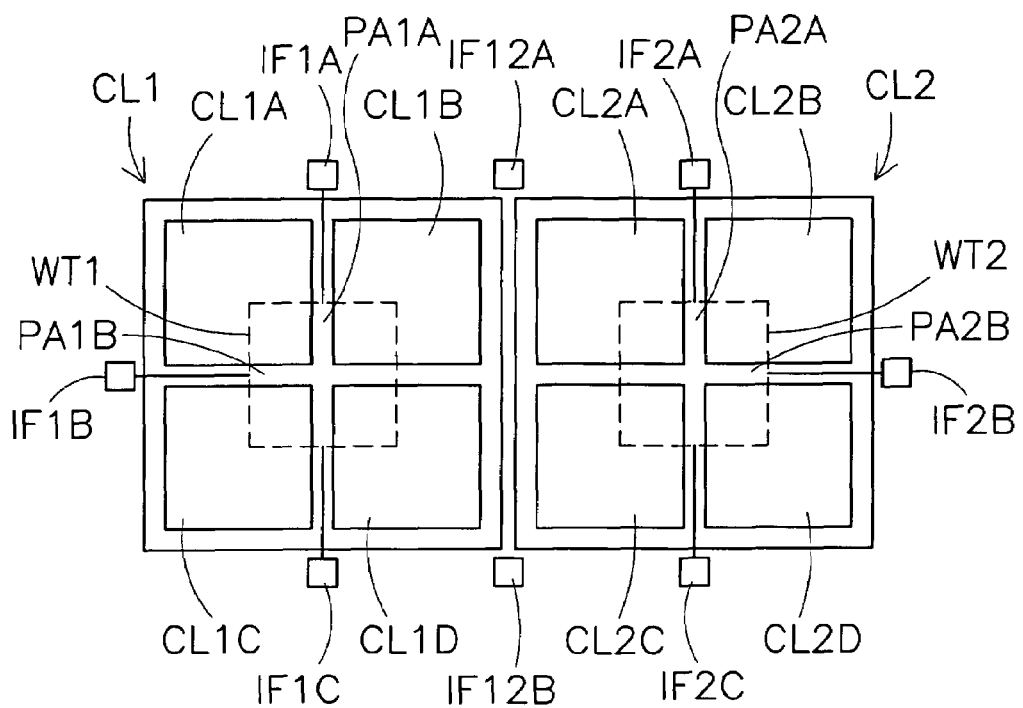
FIG. 2 depicts a schematic top view of a stage, in this example a dual stage, according to an embodiment of the invention.

FIG. 2 shows a stage system of a so called dual stage lithographic apparatus, including a first stage, including in this example substrate table WT1 and a second stage, including in this example substrate table WT2. The dual stage lithographic apparatus allows processing of two substrates at a same time, e.g. the first substrate table WT1 may be applied to expose a substrate to the patterned beam of radiation, while the second substrate table WT2 may be applied to perform substrate measurements, e.g. measuring a flatness of a to be exposed surface of the substrate. It is noted that, although a dual stage configuration is shown and described here, embodiments of the invention are not limited to such configuration, but could be applied to any stage configuration. It is noted that in FIG. 2 and FIG. 3, the position of the substrate tables is symbolically indicated by a dotted line and in a see through view.

Each of the stage systems includes a stationary motor coil assembly CL1 respectively CL2, and a substrate table WT1 respectively WT2, which each could be of a form and type described above with reference to substrate table WT in FIG. 1. The substrate tables WT1, WT2 each include a magnet, or in a practical implementation a plurality of magnets, when driving the coil CL1, CL2, a magnetic field generated in operation by the coils, generates a field which interacts with the magnet or magnets of the respective substrate table WT1, WT2, to thereby generate a force onto the substrate table. Each of the stage systems further includes a position measurement system to measure a position of the substrate table. Results of a position measurement may be applied to drive the respective motor via a suitable control system, to thereby enable an accurate positioning (and/or velocity control, acceleration control etc.) of the substrate table WT1 respectively WT2. The position measurement system includes a plurality of interferometers, including in this embodiment interferometers IF1A, IF1B, IF1C to measure a position of substrate table WT1 and interferometers IF2A, IF2B and IF2C to measure a position of substrate table WT2. Further, an interferometer IF12A and IF12B may be provided to measure a position of either one of the substrate tables when swapping stages.

In FIG. 2, coil assembly CL1 includes 4 coils, i.e. coil CL1A, CL1B, CL1C and CL1D. Similarly, coil assembly CL2 includes coils CL2A, CL2B, CL2C and CL2D. Between these coils, a path is left open: between coils CL1A and CL1B, as well as between coils CL1C and CL1D, coil assembly path PA1A is left open, while between coils CL1A and CL1C, as well as between coils CL1B and CL1D, coil assembly path PA1B is left open. Similarly, between coils CL2A and CL2B, as well as between coils CL2C and CL2D, coil assembly path PA2A is left open, while between coils CL2A and CL2C, as well as between coils CL2B and CL2D, coils assembly path PA2B is left open. Path PA1A extends below interferometer beam paths of interferometer beams of interferometers IF1A and IF1C. Path PA1B extends below an interferometer beam path of an interferometer beam of interferometer IF1B. By the paths between the coils, a dissipation by the coils may have a substantially less effect on a temperature along the respective interferometer beam paths. As explained previously, interferometer distance measurements are dependent on a wavelength of the interferometer beam, which wavelength may exhibit some temperature dependency. Therefore, distance measurements by the interferometers (from which a position of the substrate table is derived) will show some temperature dependency. In part, such temperature dependency could be corrected for by combining measurement results of e.g. interferometers IF1A and IF1C, as a total of the distances measured by these interferometers should yield a constant value. Such compensation may however not be applied for IF1B, as no interferometer at an opposed side of the substrate table WT1 is provided here. Furthermore, even when combining measurement results of IF1A and IF1C, local temperature differences cannot be taken into account (e.g. the beam of IF1A could travel a path at a different temperature than that of IF1C, which may not be corrected by the above compensation technique, thus resulting in a positioning error of the substrate table. The embodiment of FIG. 2 may allow an accurate determination of the position of the substrate table WT, as the substantially orthogonal paths below the (partly) substantially orthogonal beams of interferometers allow measurements in more than one direction by the interferometers, thereby possibly benefiting from effects provided by the coil assembly paths as described above.

Coil assemblies CL1 and CL2 each provide a working area for the respective stage, in this example coil assembly CL1 providing a range of movement for an exposure of a substrate W held by the substrate table WT1, while coil assembly CL2 provides a range of movement for (a flatness measurement of) another substrate W held by substrate table WT2. After having performed the exposure and the flatness measurement, the stages may be swapped, e.g. substrate table WT2 is moved to coil assembly CL1 to enable exposure of the substrate of which the flatness has just been measured, and substrate table WT1 may be moved to coil assembly CL2, where the exposed substrate may be replaced by a following substrate, followed by a flatness measurement thereof. To enable the swapping of stages, additional coils may be provided in the coil assembly, however the swapping may also be performed by a suitable driving of the coils of the coil assemblies described here.

The paths between the coils may be free from coil windings. Alternatively deactivated, e.g. disconnected, coil windings may be provided along the path.

US 2005/0255624 shows a base separating portion forming a small gap between the coil assemblies of the two stages, i.e. in a swapping area of the stages. During normal operation of a stage, the stages are moved in a working area, i.e. in this example in an exposure process area and/or a measurement process area respectively, which areas are remote from the base separating portion. Also, an interferometer to measure the positions of the stages in the swapping area is not used to measure the position of the stage during e.g. exposure, as the stage will during exposure stay remote from the base separating portion. An accurate portioning of the stage is desired for exposure as well as for measurement. Therefore, accurate position measurements are desired especially in the area where exposure and measurement take place. In that area, no gap in the coils is provided. Furthermore, the gap provided by the base separating portion is small, that it would not provide any of the effects as may occur in the stage system described herein.

Figure 3:
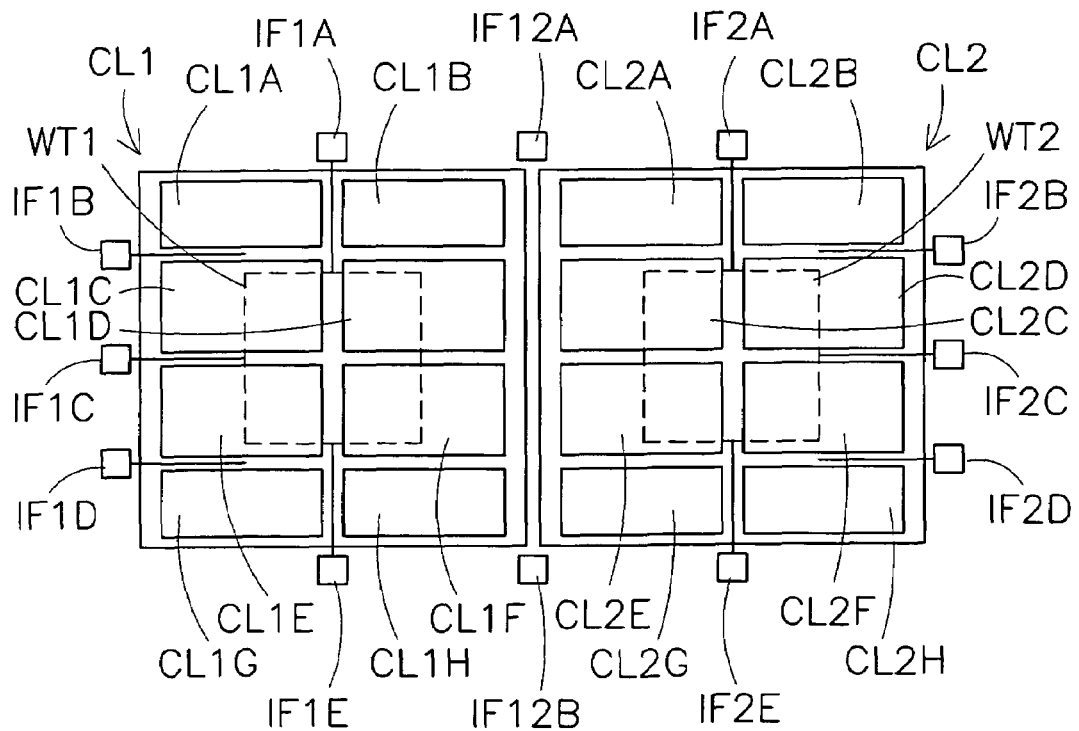
FIG. 3 depicts a schematic top view of a stage, again in this example a dual stage, according to another embodiment of the invention.

FIG. 3 shows another example of a dual stage configuration. It will be appreciated that the embodiment of FIG. 3 may also be applied in any other stage configuration, such as a single stage configuration. Coil assembly CL1 to drive substrate table WT1 includes coils CL1A-CL1H, interferometers IF1A-IF1E are provided to measure a position of substrate table WT1. Similarly, coil assembly CL2 to drive substrate table WT12 includes coils CL2A-CL2H, interferometers IF2A-IF2E are provided to measure a position of substrate table WT2. As shown in FIG. 3, the coils CL1A-CL1H and CL2A-CL2H are arranged in a matrix of 2 coils in x direction and 4 coils in y direction, to form a 2×4 matrix of coils. Between the coils, coil assembly paths are left unused, as also described above with reference to FIG. 2. The matrix structure of 2×4 coils of coils assembly CL1 provides for 3 paths in x direction and 1 path in y direction. The interferometers are positioned to provide interferometer beams paths over the coil assembly paths, the coils assembly paths thus being substantially below the interferometer beam paths. The 3 interferometers IF1B to IF1D having an interferometer beam in x direction may not be applied for position measurements of substrate table WT1 simultaneously, instead, depending on a position of the substrate table in the working area determined by a surface of the coils assembly CL1, one or two of the interferometers IF1B-IF1D may be applied. By providing interferometers IF1B-IF1D to measure the position of the substrate table WT1 from a same side, a large range of movement of the substrate table WT1 may be provided. Furthermore, a rotation of the substrate table with respect to an axis extending substantially parallel to a z axis (which is perpendicular to the plane of drawing), may be determined from a measurement by at least two of the three interferometers IF1B-IF1D. Furthermore, similar to FIG. 2, interferometers IF12A and IF12B are provided to measure a position of the substrate tables when swapping the substrate tables, i.e. when moving substrate table WT1 from coil assembly CL1 to coil assembly CL2 and/or when moving substrate table WT2 from coil assembly CL2 to coil assembly CL1. As described above, a path between the coils and below measurement beam paths of measurement beams of IF12A and IF12B, may be provided too, similarly as described with reference to FIG. 2.

FIGS. 4A and 4B each depict a cross sectional side view of a detail of a stage system, showing coils CL1A and CL1B of a coil assembly CL1, and coil assembly path PA1A between the coils CL1A and CL1B. Also, interferometer beam path IFP1 of interferometer IF1A (not shown here) is symbolically indicated by a dotted line. A beam IFB1 of the interferometer IF1A extends in a direction perpendicular to the plane of drawing. Due to heat dissipation in the coils CL1A, CL1B, a gas which is ambient to the coil assembly CL1, is heated thereby resulting in an upward flow of the gas. A gas flowing guiding device GD may be provided, such as plate PL in FIG. 4A or V shaped profile VP in FIG. 4B, to guide such heated gas away from the interferometer beam path which may reduce an effect of the dissipation in the coils CL1A, CL1B on a temperature along the interferometer beam path. To provide an effective guiding away of heated gasses, a point of the V shaped profile may be orientated towards the coil assembly path. Alternatively or in addition to the gas flowing device, a gas flow generating device to generate a gas flow in either upward (as symbolically indicated by arrow GFU) or downward (as symbolically indicated by arrow GFD) direction can be provided to keep gasses heated by dissipation from the coils, away from the interferometer beam path.

FIGS. 5A, 5B and 5C each depict a cross sectional side view of an embodiment of the substrate table or stage. FIGS. 5A-5C each show coils CL1A, CL1B of coil assembly CL1 and a coil assembly path between coils CL1A and CL1B. FIGS. 5A-5C each show a different embodiment of the substrate table WT. In FIG. 5A, the substrate table WT includes an array of magnets MAG, thereby enabling the substrate table to travel over the coil assembly path between coils CL1A and CL1B of the coil assembly CL1. A reflecting surface of the substrate table to reflect one or more interferometer beams, is indicated by RS.

In FIG. 5B, 2 magnets or magnet arrays MAG are used, located at edges of the substrate table WT. Depending on a size of the magnets MA and a size of the path between the coils CL1A, CL1B, the substrate table WT may in this example not be able to "cross" the opening between the coils CL1A, CL1B as provided by the path. Therefore, in the FIG. 5B embodiment, a distance between the magnets MA may be at least equal to a optically usable size of the substrate table (as defined by here by the dimensions of the to be optically exposed substrate W), to thereby allow a range of movement of the substrate table which substantially equals the usable size of the substrate table. FIG. 5B further shows the V shaped profile VP as described above, a recess being provided in an underside of the substrate table to allow the substrate table to move over the V shaped profile. A reflecting surface of the substrate table to reflect one or more interferometer beams, is indicated by RS.

In FIG. 5C, a substrate table WT is shown which largely corresponds to the substrate table shown in FIG. 5B. However, to simplify a construction thereof, the reflecting surfaces RS thereof have been placed further apart, a distance between reflecting surfaces on opposing sides of the substrate table being substantially equal to an outside distance between corresponding magnets MA. It is noted that in FIG. 5B as well as FIG. 5C, the shown position may form a rightmost position (in the plane of drawing) of the substrate table WT relative to its range of movement, in case that the magnets of the FIGS. 5B and 5C embodiments could not traverse the path between the coils.

Although in the above exemplary embodiments interferometers have been used as position measurement devices, any other optical position measurement device may be applied, such as an encoder. Consequently, where in the above the words interferometer beam have been applied, such beam can also be understood as to include an encoder beam or other measurement beam. Further, in the above examples, the coil assembly paths have been depicted as continuous paths which thus divide the coil of the coil assembly in separate coils, however alternatively, the coil assembly paths can form suitable recesses in the coil assembly. Still further, in the above, a substrate stage has been described as an example. The above embodiments, as well as the developments presented in this document, are also applicable to any other stage of the lithographic apparatus, such as a reticle stage, thereby providing same or similar benefits and/or effects as described above. The coil assembly paths between the coils may be open or partly open, e.g. to allow a gas flow thereto. Alternatively, the paths may be closed, e.g. form an integral part of a coil assembly structure, thereby providing a stable mechanical construction. Any type of coils may be used in the coil assembly, the coil assembly thus not being restricted to the coils having diagonal windings as described in US 2005/0255624. Further, embodiments of the invention may not only applied to a dual stage lithographic apparatus, but also to any other type of lithographic apparatus, such as a single stage lithographic apparatus or any other lithographic apparatus employing a stationary coil motor to drive a movable part such as the substrate table or the mask table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that embodiments of the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, an embodiment of the invention may include a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A stage system for a lithographic apparatus, the stage system comprising:
   a movable stage;
   a stationary motor coil assembly including a plurality of coils to interact with a magnet assembly of the movable stage to thereby form a moving magnet motor to drive the stage; and
   a position measurement system to measure a position of the movable stage in a working area, the position measurement system configured to transfer a measurement beam along a measurement beam path that extends over a part of the stationary motor coil assembly towards the stage, the stationary motor coil assembly comprising a coil assembly path that extends between the plurality of coils and below the measurement beam path.

2. The stage system according to claim 1, wherein a gas flow guiding device is provided between the measurement beam path and the coil assembly path to guide a gas flow away from the measurement beam path.

3. The stage system according to claim 2, wherein the gas flow guiding device comprises a plate, a surface of the plate extending substantially parallel to a surface of the motor coil assembly.

4. The stage system according to claim 2, wherein the gas flow guiding device comprises a profile having a substantially V shaped cross section, an apex portion of the V shaped cross section being orientated towards the coil assembly path.

5. The stage system according to claim 1, comprising a gas flow generating device to provide a gas flow from the coil assembly path towards the measurement beam path.

6. The stage system according to claim 1, wherein a distance in a direction of movement of the stage between the magnets of the stage at least equals an optically usable size of an element held by the stage.

7. The stage system according to claim 6, wherein the movable stage comprises four magnets to interact with the coil assembly, each of the four magnets being positioned at a respective corner of the movable stage, a distance between two magnets along a side of the movable stage being at least equal to a dimension of the side.

8. The stage system according to claim 1, wherein the stage comprises a substrate table of a lithographic apparatus, the position measurement system to transfer two measurement beams along two substantially orthogonal measurement beam paths, each measurement beam path extending over a respective part of the motor coil assembly, the coil assembly comprising two paths between the plurality of coils, each path extending below a respective one of the measurement beam paths.

9. The stage system according to claim 1 wherein the working area comprises one of an exposure area or a substrate surface flatness measurement area.

10. The stage system according to claim 1, wherein the magnet assembly comprises a plurality of magnets.

11. A lithographic apparatus comprising
   (a) an illumination system configured to condition a radiation beam;
   (b) a patterning device support constructed to support a patterning device, the patterning device being capable of imparting the radiation beam with a pattern in its cross-section to form a patterned radiation beam;
   (c) a substrate support constructed to hold a substrate;
   (d) a projection system configured to project the patterned radiation beam onto a target portion of the substrate;
   (e) a positioning device configured to position one of the supports, the positioning device comprising a stationary motor coil assembly including a plurality of coils to interact with a magnet assembly of the one of the supports to thereby form a moving magnet motor to drive said one of the supports, and
   (f) a position measurement system to measure a position of said one of the supports in a working area,
   wherein the position measurement system is configured to transfer a measurement beam along a measurement beam path that extends over a part of the stationary motor coil assembly towards said one of the supports, the stationary motor coil assembly comprising a coil assembly path that extends between the plurality of coils and below the measurement beam path.

12. The lithographic apparatus according to claim 11, wherein the positioning device is configured to position the substrate support, the position measurement system to transfer two measurement beams along two substantially orthogonal measurement beam paths, each measurement beam path extending over a respective part of the motor coil assembly, the coil assembly comprising two paths between the coils, each path extending below a respective one of the measurement beam paths.

13. A method of manufacturing a device, comprising
   irradiating a pattern onto a substrate with a lithographic apparatus according to claim 11;
   developing the irradiated substrate; and
   manufacturing a device from the developed substrate.

14. A stage system for a lithographic apparatus, the stage system comprising:
   a movable stage,
   a positioning device configured to position the movable stage, the positioning device including a coil assembly and a magnet assembly, the coil assembly configured to interact with the magnet assembly to position the movable stage, the coil assembly including at least a pair of coils that are spaced apart so as to define a path therebetween; and
   a position measurement system configured to measure a position of the movable stage, the position measurement system configured to output a measurement radiation beam along a measurement beam path that extends over a part of the coil assembly towards the movable stage, the measurement beam path being substantially parallel to and positioned above the path between the pair of coils.

15. The stage system according to claim 14, further comprising a gas flow guiding device arranged between the measurement beam path and the path between the pair of coils, the gas flow guiding device configured to guide a gas flow away from the measurement beam path.

16. The stage system according to claim 15, wherein the gas flow guiding device comprises a plate, a surface of the plate extending substantially parallel to a surface of the coil assembly.

17. The stage system according to claim 15, wherein the gas flow guiding device comprises a profile having a substantially V shaped cross section, an apex portion of V shaped cross section being orientated towards the path between the pair of coils.

18. The stage system according to claim 14, comprising a gas flow generating device configured to provide a gas flow from the path between the pair of coils towards the measurement beam path.

19. The stage system according to claim 14, wherein the coil assembly includes more than one pair of coils.

* * * * *